United States Patent
Clevenger et al.

(10) Patent No.: US 10,923,575 B2
(45) Date of Patent: Feb. 16, 2021

(54) LOW RESISTANCE CONTACT FOR TRANSISTORS

(71) Applicant: INTERNATIONAL BUSINESS MACHINES CORPORATION, Armonk, NY (US)

(72) Inventors: Lawrence A. Clevenger, Saratoga Springs, NY (US); Junli Wang, Slingerlands, NY (US); Kirk D. Peterson, Jericho, VT (US); Baozhen Li, South Burlington, VT (US); Terry A. Spooner, Mechanicville, NY (US); John E. Sheets, II, Zumbrota, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/546,351

(22) Filed: Aug. 21, 2019

(65) Prior Publication Data

US 2020/0013868 A1 Jan. 9, 2020

Related U.S. Application Data

(62) Division of application No. 16/026,337, filed on Jul. 3, 2018, now Pat. No. 10,468,491.

(51) Int. Cl.
*H01L 29/417* (2006.01)
*H01L 29/45* (2006.01)
(Continued)

(52) U.S. Cl.
CPC ........ *H01L 29/45* (2013.01); *H01L 21/76802* (2013.01); *H01L 21/76831* (2013.01);
(Continued)

(58) Field of Classification Search
CPC .......... H01L 27/0886; H01L 29/42312; H01L 29/42316; H01L 29/41; H01L 29/417; H01L 29/41725; H01L 29/41766
See application file for complete search history.

(56) References Cited

U.S. PATENT DOCUMENTS

| 5,831,283 A | 11/1998 | Batey et al. |
| 6,165,917 A | 12/2000 | Batey et al. |

(Continued)

FOREIGN PATENT DOCUMENTS

JP 2015154078 A 8/2015

OTHER PUBLICATIONS

Clevenger, Lawrence A. et al., "Low Resistance Contact for Transistors" U.S. Appl. No. 16/026,337, filed Jul. 3, 2018.
(Continued)

*Primary Examiner* — Jae Lee
(74) *Attorney, Agent, or Firm* — Cantor Colburn LLP; Douglas Pearson

(57) ABSTRACT

According to an embodiment of the present invention, a method for forming contacts includes forming an oxide layer over and along a first liner layer. A first spacer layer is formed along the first liner layer opposing the oxide layer. A work function metal layer is formed along the first spacer layer opposing the first liner layer. A gate is formed on and along the work function metal opposing the first spacer. A second spacer layer is formed on the oxide layer. Portions of the oxide layer, the first liner layer, the first spacer, the work function metal layer and the second spacer layer are removed which forms a recess between the gate and the first spacer layer. A second liner layer is deposited in the recess. A low-resistance metal is deposited in the removed portions to form the first contact.

9 Claims, 10 Drawing Sheets

(51) Int. Cl.
*H01L 29/66* (2006.01)
*H01L 21/768* (2006.01)
*H01L 29/78* (2006.01)

(52) U.S. Cl.
CPC .. *H01L 21/76877* (2013.01); *H01L 29/41791* (2013.01); *H01L 29/6653* (2013.01); *H01L 29/6656* (2013.01); *H01L 29/7851* (2013.01)

(56) References Cited

U.S. PATENT DOCUMENTS

| | | | |
|---|---|---|---|
| 6,346,467 B1 | 2/2002 | Chang et al. | |
| 6,420,282 B1 | 7/2002 | Batey et al. | |
| 6,531,749 B1 | 3/2003 | Matsuki et al. | |
| 6,545,295 B2 | 4/2003 | Batey et al. | |
| 6,927,154 B2 | 8/2005 | Graf et al. | |
| 7,265,450 B2 | 9/2007 | Handa et al. | |
| 7,445,996 B2 | 11/2008 | McDaniel | |
| 8,609,524 B2 | 12/2013 | Frohberg et al. | |
| 9,117,918 B2 | 8/2015 | Shieh et al. | |
| 9,318,447 B2 | 4/2016 | Peng et al. | |
| 9,865,697 B1* | 1/2018 | Hsueh | H01L 29/4966 |
| 10,008,578 B1* | 6/2018 | Lee | H01L 21/28026 |
| 2011/0014763 A1 | 1/2011 | Sreekantham et al. | |
| 2015/0137194 A1 | 5/2015 | Wei | |
| 2015/0206754 A1 | 7/2015 | Horak et al. | |
| 2016/0020180 A1 | 1/2016 | Peng et al. | |
| 2016/0343706 A1 | 11/2016 | Chang et al. | |
| 2018/0175201 A1* | 6/2018 | Wang | H01L 29/66795 |
| 2018/0331219 A1 | 11/2018 | Liou et al. | |
| 2018/0366553 A1 | 12/2018 | Zang et al. | |
| 2019/0027586 A1* | 1/2019 | Zang | H01L 29/66787 |

OTHER PUBLICATIONS

IBM "List of IBM Patents or Patent Applications Treated as Related"; Date Filed: Aug. 21, 2019, 2 pages.

* cited by examiner

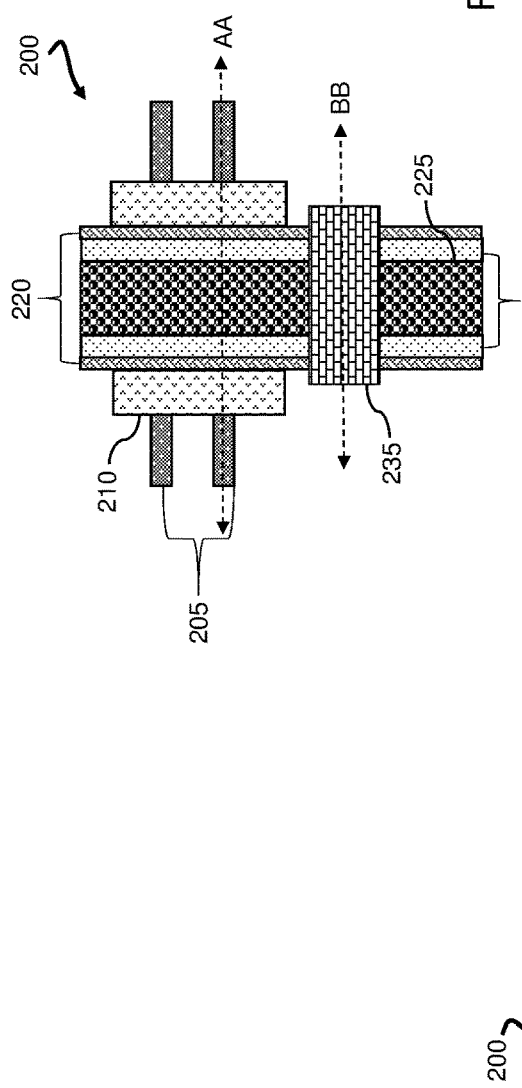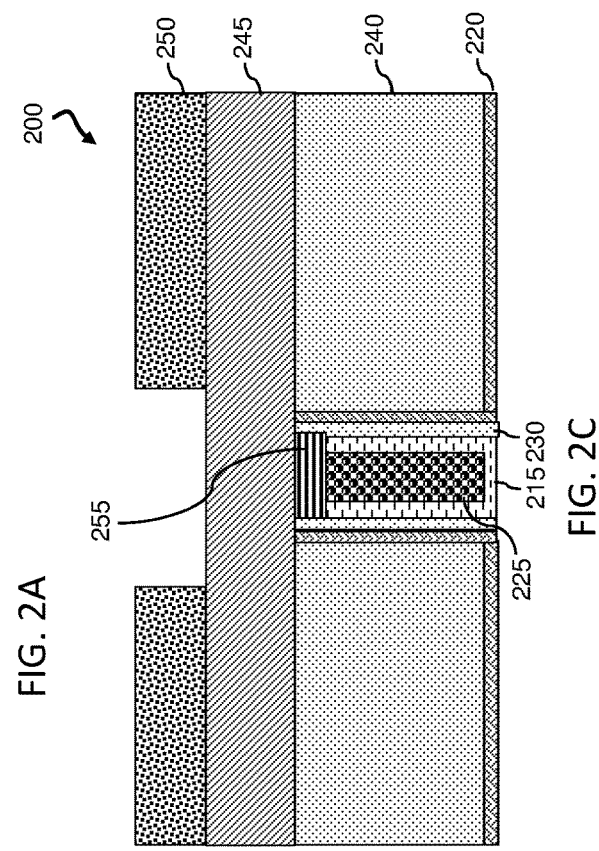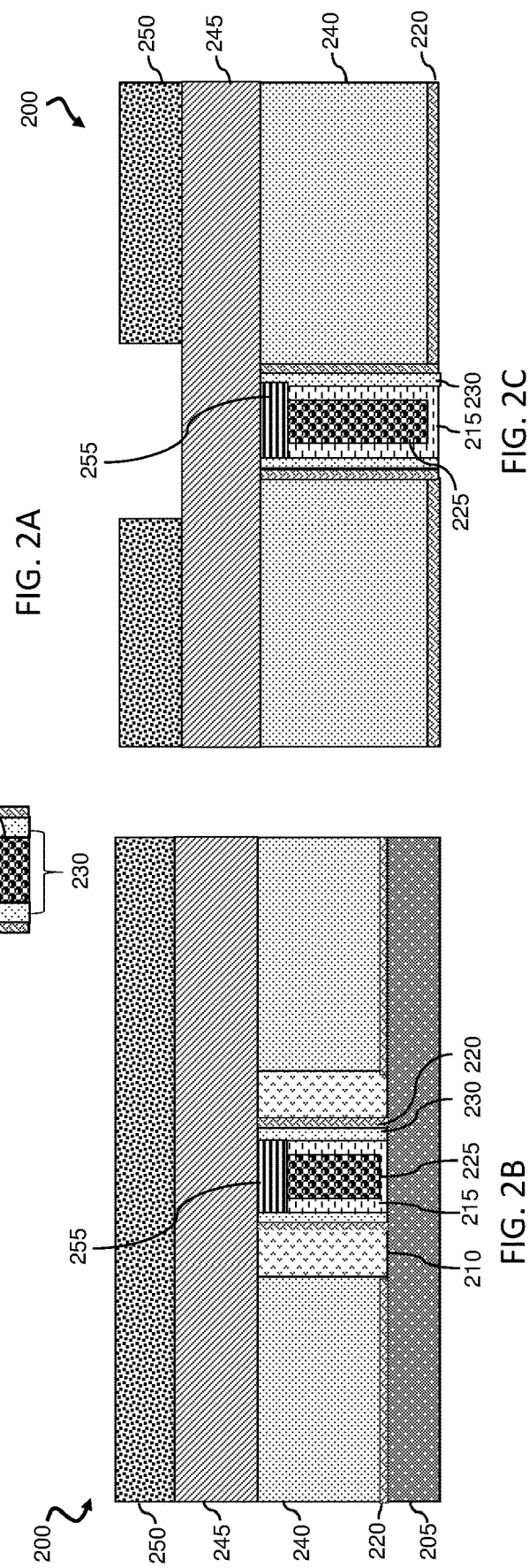

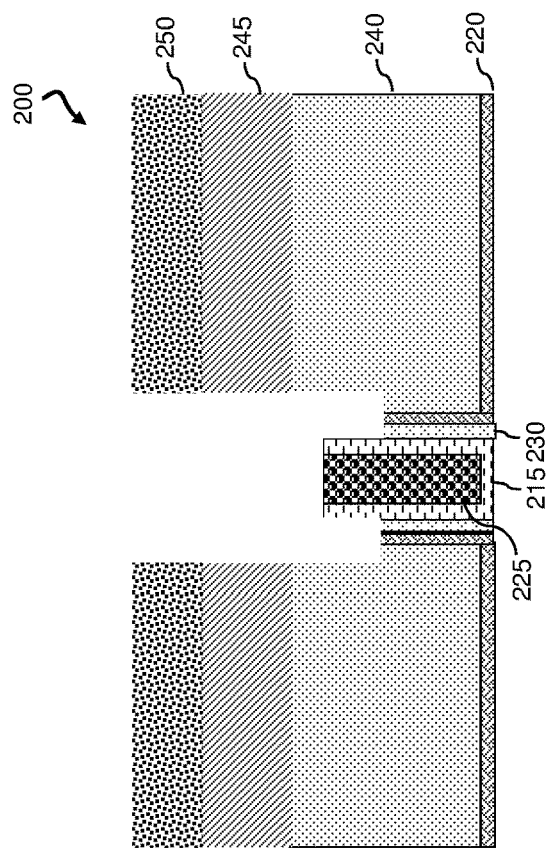
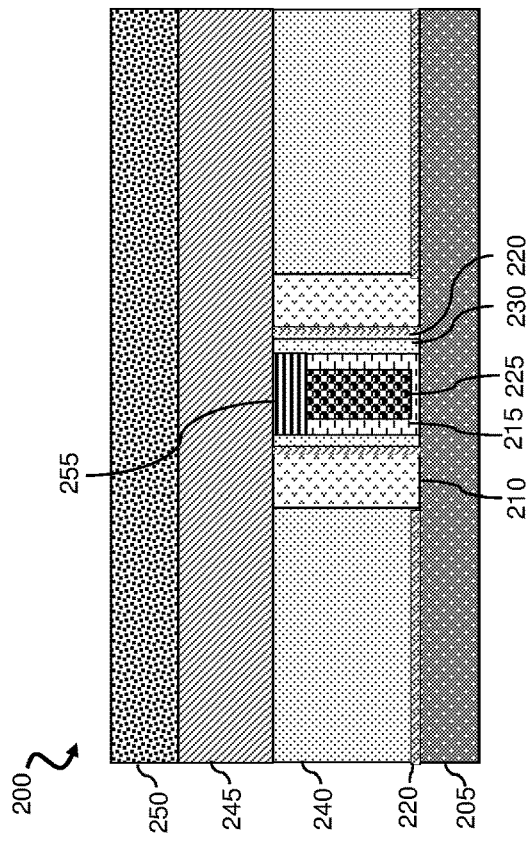
FIG. 3B
FIG. 3A

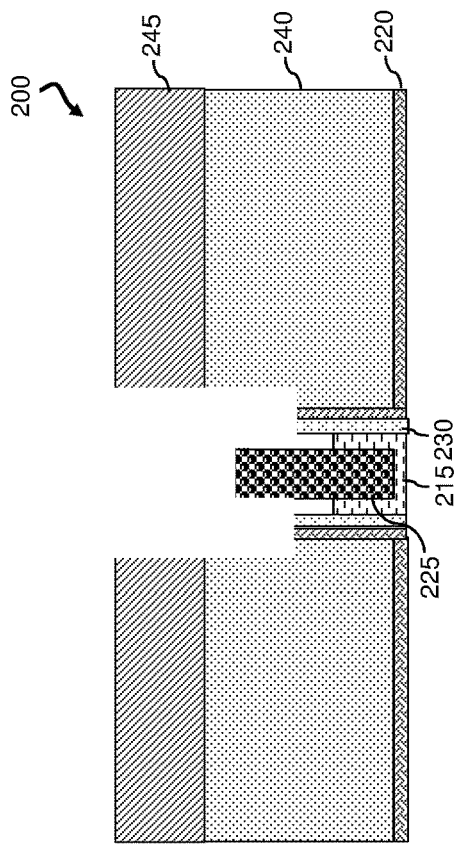
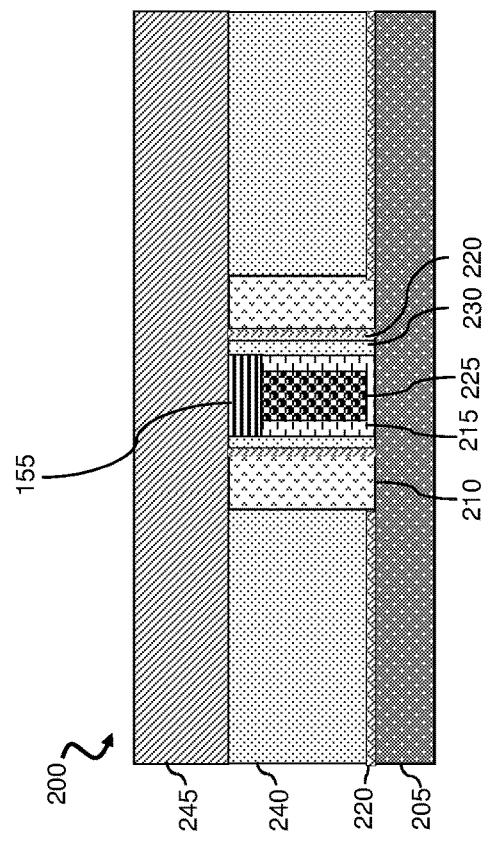
FIG. 5B
FIG. 5A

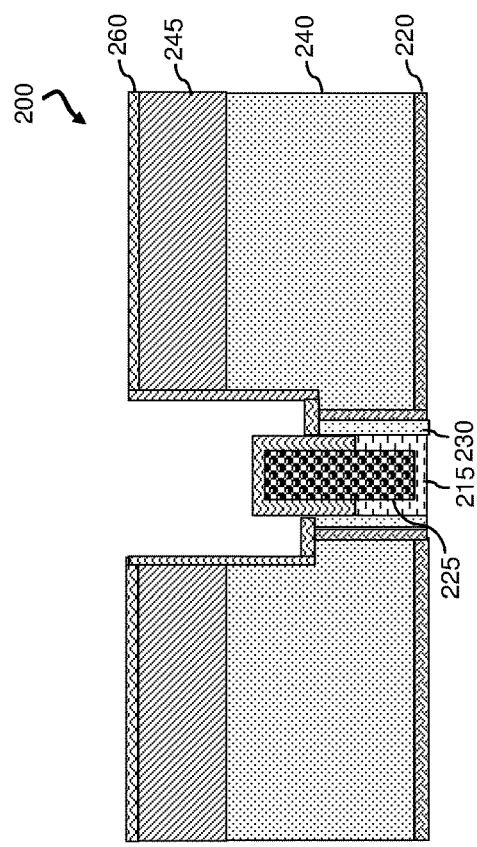
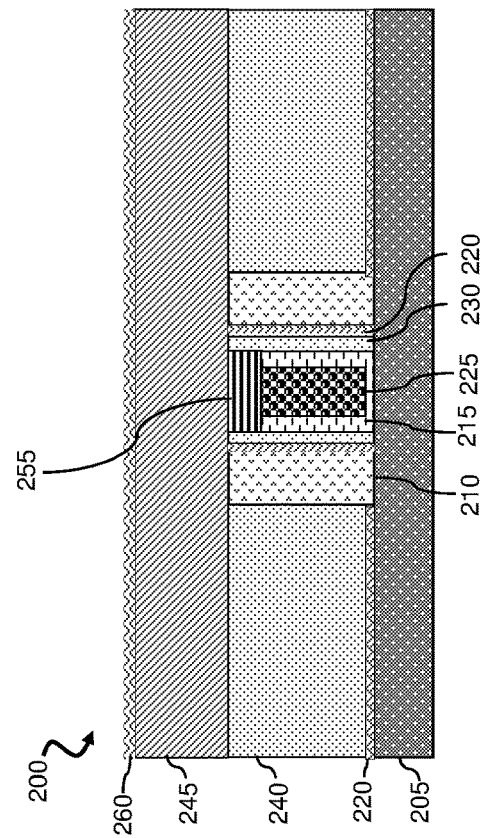
FIG. 6A
FIG. 6B

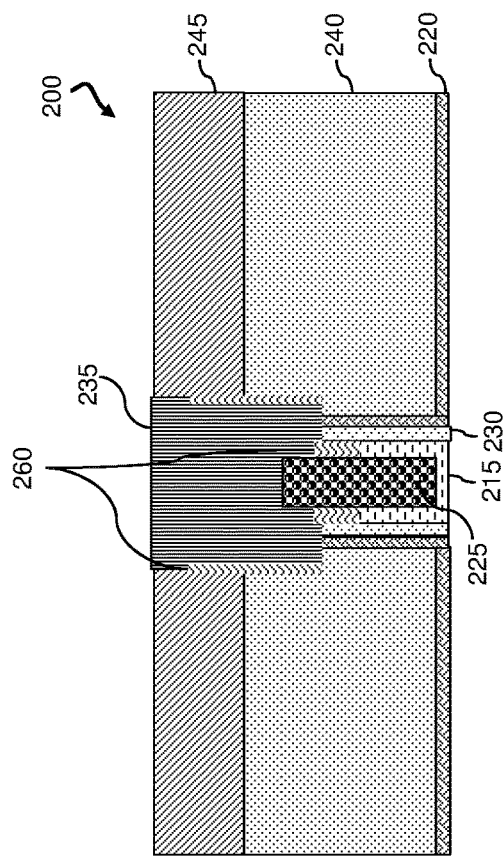
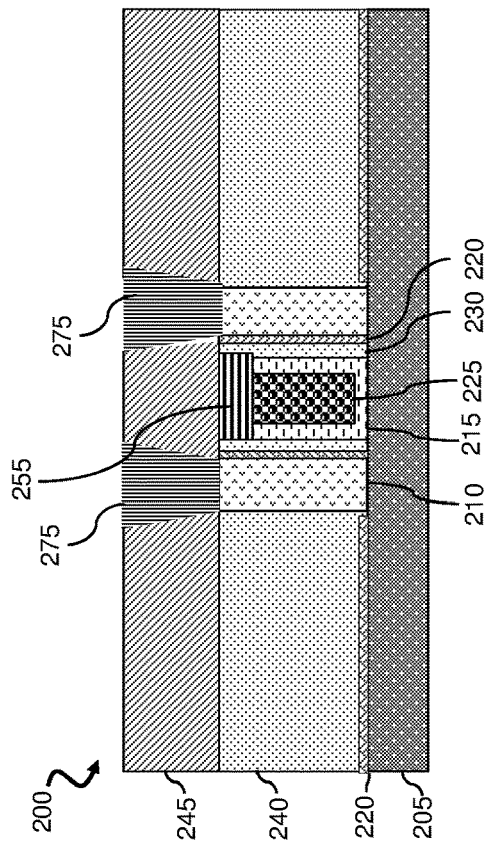
FIG. 10A
FIG. 10B

LOW RESISTANCE CONTACT FOR TRANSISTORS

DOMESTIC PRIORITY

This application is a Divisional of the legally related U.S. application Ser. No. 16/026,337 filed Jul. 3, 2018, the contents of which are incorporated by reference herein in their entirety.

BACKGROUND

The present invention generally relates to fabrication methods and resulting structures for semiconductor devices. More specifically, the present invention relates to fabrication methods and resulting structures for FinFET transistors, wherein contacts of the FinFET are made from low-resistance metals.

The metal oxide semiconductor field effect transistor (MOSFET) is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

A FinFET is a non-planar MOSFET structure that has as a main feature an elongated fin-shaped element. The gate is wrapped around a central portion of the fin. The portion of the fin that is under the gate functions as the channel. The portions of the fin that are not under the gate function as the source or the drain (S/D), respectively. The thickness of the fin determines an effective channel length of the device.

SUMMARY

According to an embodiment of the present invention, a method for forming contacts includes forming an oxide layer over and along a first liner layer. A first spacer layer is formed along the first liner layer opposing the oxide layer. A work function metal layer is formed along the first spacer layer opposing the first liner layer. A gate is formed on and along the work function metal opposing the first spacer. A second spacer layer is formed on the oxide layer. Portions of the oxide layer, the first liner layer, the first spacer, the work function metal layer and the second spacer layer are removed which forms a recess between the gate and the first spacer layer. A second liner layer is deposited in the recess. A low-resistance metal is deposited in the removed portions of the oxide layer, the first liner layer, the first spacer, and the second spacer layer, as well as on the gate and the second liner layer to form the first contact.

According to an embodiment of the present invention, a semiconductor device includes a fin, wherein the fin is coupled to a source or a drain (S/D). A work function metal is coupled to the fin and a gate. A liner is coupled to the work function metal. A first contact is coupled to the gate in which the liner provides a barrier between the first contact and the work function metal. A trench silicide region is coupled to the fin. A second contact is coupled to the trench silicide region.

BRIEF DESCRIPTION OF THE DRAWINGS

FIG. 2A is a cross-sectional view of a view structure showing a schematic top view according to embodiments of the present invention;

FIG. 2B is a cross-sectional view of the structure device along a section line AA transversely through fins according to embodiments of the present invention;

FIG. 2C is a cross-sectional view of the structure device along a section line BB transversely through a gate contact according to embodiments of the present invention;

FIG. 3A is a cross-sectional view of the structure along a section line AA transversely through fins after removal of portions of the spacer layer, filling material, cap, spacer layer, liner and work function metal layer according to embodiments of the present invention;

FIG. 3B is a cross-sectional view of the structure along a section line BB transversely through the gate contact after removal of a portion of the spacer layer, filling material, cap, spacer layer, liner and work function metal layer according to embodiments of the present invention;

FIG. 5A is a cross-sectional view of the structure along a section line AA transversely through fins after removal of a contact to gate (CB) mask according to embodiments of the present invention;

FIG. 5B is a cross-sectional view of the structure along a section line BB transversely through the gate contact after removal of the CB mask according to embodiments of the present invention;

FIG. 6A is a cross-sectional view of the structure along a section line AA transversely through fins after deposition of a barrier layer according to embodiments of the present invention;

FIG. 6B is a cross-sectional view of the structure along a section line BB transversely through the gate contact after deposition of the barrier layer according to embodiments of the present invention;

FIG. 10A is a cross-sectional view of the structure along a section line AA transversely through fins after formation of contacts CA according to embodiments of the present invention; and FIG. 10B is a cross-sectional view of the semiconductor device along a section line BB transversely through the gate contact after formation of contact CB according to embodiments of the present invention.

Figure 1:
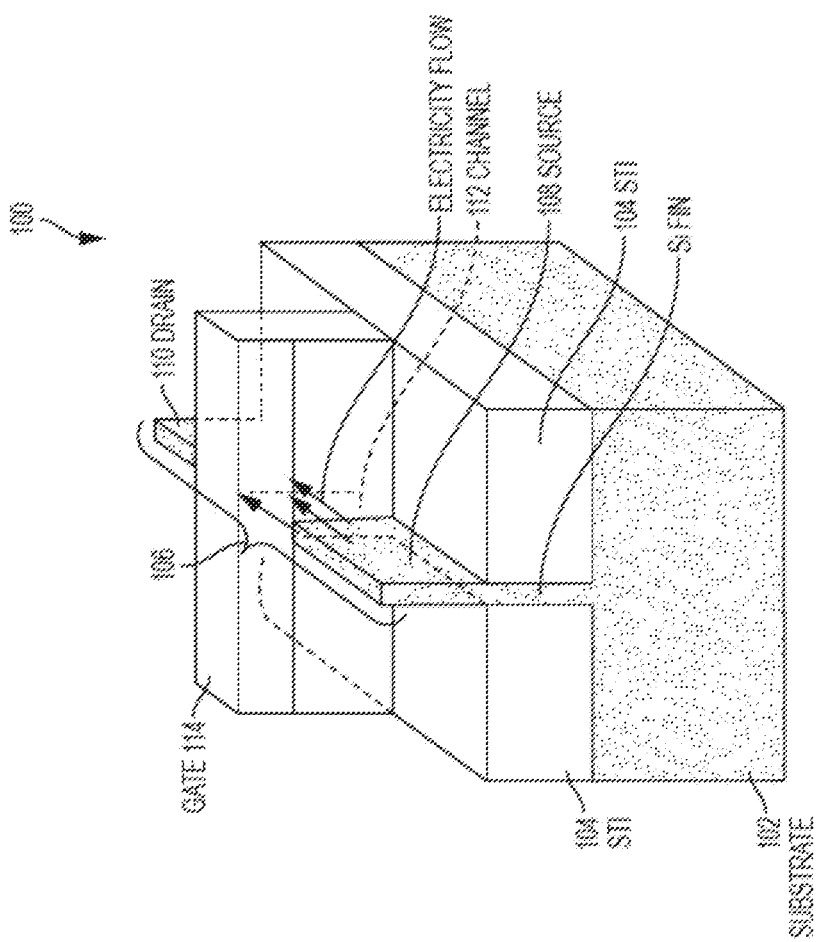
FIG. 1 depicts a three-dimensional view of an exemplary configuration of a known FinFET device.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of one or more embodiments of the present invention are unique.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

Turning now to a more detailed description of technologies that are more specifically relevant to embodiments of the present invention, as previously described herein, semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. A type of MOSFET is a FinFET.

FIG. 1 is a three-dimensional view of an exemplary FinFET 105, which includes a shallow trench isolation (STI) region 104 for isolation of active areas from one another. The basic electrical layout and mode of operation of FinFET 105 do not differ significantly from a traditional field effect transistor. FinFET 105 includes a semiconductor substrate 102, local STI region 104, a fin 106, and a gate 114 having a gate oxide layer (not shown) between the gate and the fin, configured and arranged as shown. Fin 106 includes a source region 108, a drain region 116, and a channel region 112, wherein gate 114 extends over the top and sides of channel region 112. For ease of illustration, a single fin is shown in FIG. 1. In practice, FinFET devices are fabricated having multiple fins formed on local STI region 104 and substrate 102. Substrate 102 can be silicon, and local STI region 104 can be an oxide (e.g., SiO$_2$). Fin 106 can be silicon. Gate 114 controls the source to drain current flow (labeled ELECTRICITY FLOW in FIG. 1). In contrast to a planar MOSFET, however, source 108, drain 116, and channel 112 are built as a three-dimensional bar on top of local STI region 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain (S/D) regions are the portions of the fin on either side of the channel that are not under the gate electrode. The source and drain regions can be suitably doped to produce the desired FET polarity, as is known in the art. The dimensions of the fin establish the effective channel length for the transistor.

Contacts (not shown) can be formed on the gate 114 and the S/D regions 108, 116 of the FinFET 105 to provide electrical connections thereto. Traditionally, Tungsten (W) together with liner material (e.g., titanium nitride (TiN) or tantalum nitride (TaN)) used as wetting layer are used to form the contacts. Tungsten is often used because Tungsten is a stable metal and processing this metal has been well established. However, using tungsten (W) or another high resistance material to form the contacts leads to an increased level of resistance during middle of the line (MOL) processing. In consideration of dimension scaling for semiconductor devices, using lower-resistivity metals would be preferred in order to reduce the resistance. However, using low resistance materials (i.e., a material that readily allows the flow of electric current) to form contacts can be problematic because using low resistance materials tend to have reliability issues, such as creating a short circuit due to the gate contacting the work function metal.

Turning now to an overview of the aspects of the invention, one or more embodiments of the invention address the above-described shortcomings of the prior art by forming a barrier layer between a contact and work function metal which improves reliability by reducing short circuit situations when using a low resistance material as a gate contact. Accordingly, the contact can be formed on the barrier layer instead of the work function metal.

The above-described aspects of the invention address the shortcomings of the prior art by forming a three dimensional gate contact formed using a low resistance material while still preventing an unintended interaction between the gate contact and work function metal. Accordingly, a gate contact can be implemented which has a reduced contact resistance.

According to one or more embodiments, it should be appreciated that a fabrication process to build a FinFET transistor, such as the FinFET is discussed below with reference to intermediate structures 200 shown in FIGS. 2-10. The intermediate structures show the structure that results from performing the described fabrication operations.

FIG. 2A is an illustrative top view of a FinFET structure 200 which includes a section line AA' transversely through fins and a section line BB' transversely through a contact according to one or more embodiments of the present invention. Cross-sectional views at each of AA' and BB' are shown in each of FIGS. 2-10. It should be understood that fin regions of structure 200, for example, fins 205 can include (S/D) regions (not shown). Structure 200 can include a gate 225 and a gate spacer layer in the form of spacer 230 and a liner 220. Structure 200 can include a trench silicide region 210 and a gate contact (CB) 235.

FIG. 2B is a cross-sectional view of the structure 200 along a section line AA transversely through fins 205 according to embodiments of the present invention. Structure 200 can include a plurality of fins 205. The liner 220 can be formed on top of the fins 205. The liner 220 can be any suitable dielectric material, for example, carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof. In some embodiments of the invention, the liner 220 can include silicon nitride. The liner 220 can be formed utilizing a deposition process such as, for example, CVD, plasma enhanced chemical vapor deposition (PECVD), or chemical solution deposition.

A filling material 240 can be formed along portions of the liner 220 and trench silicide (TS) region 210. Any suitable oxide can be used as filling material 240. TS 210 can be formed on fin 205 and along the liner 220 and oxide layer 240. The TS 210 can be a metal silicide formed by annealing. TS 210 can include a silicide, including, for example, nickel silicide (NiSi), nickel platinum silicide (NiPt$_y$Si$_x$) cobalt silicide (CoSi$_x$) tantalum silicide (TaSi$_x$), titanium silicide (TiSi$_x$) and combinations thereof.

A spacer layer 230 can be formed along portions of the liner 220 and a work function metal (WFM) layer 215. The spacer layer 230 can be deposited by any non-conformal deposition methods that provides a faster deposition rate on the planar surface and slower deposition rate on the sidewall surface including but not limited to plasma vapor deposition (PVD), high density plasma (HDP) deposition or the like. In PVD, a pure source material is gasified via evaporation, the application of high power electricity, laser ablation, or the like. The gasified material will then condense on the substrate material to create the desired layer. In one or more embodiments, the spacer layer 230 can be a low k dielectric material. The term "low k dielectric" generally refers to an insulating material having a dielectric constant less than silicon nitride, i.e., less than 7.0. Exemplary low k dielectric materials include, but are not limited to, dielectric nitrides (e.g., silicon nitride, SiBCN), dielectric oxynitrides (e.g., SiOCN), or any combination thereof or the like.

A WFM layer 215 can be formed on fin 205 and along the gate 225 and the spacer 230. The work function setting layer can be a work function metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

A high-dielectric constant (high-k) layer (not shown) can be deposited as a gate dielectric prior to the formation of the metal gate 225. The high-k layer can have a dielectric constant greater than 3.9, 7.0, or 10.0. Non-limiting examples of suitable materials for the gate dielectric include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The metal gate 225 can be formed along portions of the high-k or WFM 215. The metal gate 225 can be formed using any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition.

A cap 255 can be formed on the metal gate 225 and along portions of the spacer 230. The cap 255 can be any suitable dialectic material, for example, a nitride material, such as, silicon nitride (SiN). The cap 255 can act as a protective material over the metal gate 225. The cap 255 can be formed utilizing a deposition process such as, for example, CVD, plasma enhanced chemical vapor deposition (PECVD), or chemical solution deposition.

A spacer layer 245 can be formed on the filling material 240, the TS 210, the liner 220, the spacer layer 230 and cap 255. The spacer layer 245 can be deposited by any non-conformal deposition methods that provides a faster deposition rate on the planar surface and slower deposition rate on the sidewall surface including but not limited to plasma vapor deposition (PVD), high density plasma (HDP) deposition or the like. In PVD, a pure source material is gasified via evaporation, the application of high power electricity, laser ablation, or the like. The gasified material will then condense on the substrate material to create the desired layer. In one or more embodiments, the spacer layer 245 can be a low k dielectric material. The term "low k dielectric" generally refers to an insulating material having a dielectric constant less than silicon nitride, i.e., less than 7.0. Exemplary low k dielectric materials include, but are not limited to, dielectric nitrides (e.g., silicon nitride, SiBCN), dielectric oxynitrides (e.g., SiOCN), or any combination thereof or the like.

A CB mask 250 can be formed on the spacer layer 245. The CB mask 250 can include, for example, a silicon nitride (SiN) hardmask. The CB mask 250 can be deposited using a deposition process, including, but not limited to, PVD, CVD, PECVD, or any combination thereof. Other mask compositions can include silicon oxides, silicon oxynitrides, silicon carbides, silicon carbonitrides, etc. Spin-on dielectrics can also be utilized as a hard mask material including, but not limited to, silsequioxanes, siloxanes, and boron phosphate silicate glass (BPSG) or the like. The CB mask 250 can have a single material or multiple materials.

FIG. 2C is a cross-sectional view of the structure 200 along a section line BB transversely through CB 235 after removal of portions of the CB mask 250 according to embodiments of the present invention. The CB mask 250 can be patterned to expose portions of the spacer layer 245 according to the desired width. The removed portion of the CB mask 250 can occur using any suitable etching process.

FIG. 3A is a cross-sectional view of the structure 200 along a section line AA transversely through fins 205 according to embodiments of the present invention. Structure 200 is unchanged from the structure 200 of FIG. 2B.

FIG. 3B is a cross-sectional view of the structure 200 along a section line BB transversely through CB 235 after removal of portions of the spacer layer 245 and filling material 240, cap 255, the spacer layer 230, the liner 220 and WFM layer 215 according to embodiments of the present invention. The spacer layer 245, filling material 240, cap 255, the spacer layer 230, the liner 220 and WFM layer 215 or portions thereof can be removed using any suitable etching process. Accordingly, portions of the gate 225, the spacer layer 230, the liner 220 and WFM layer 215 are exposed.

Figure 4B:
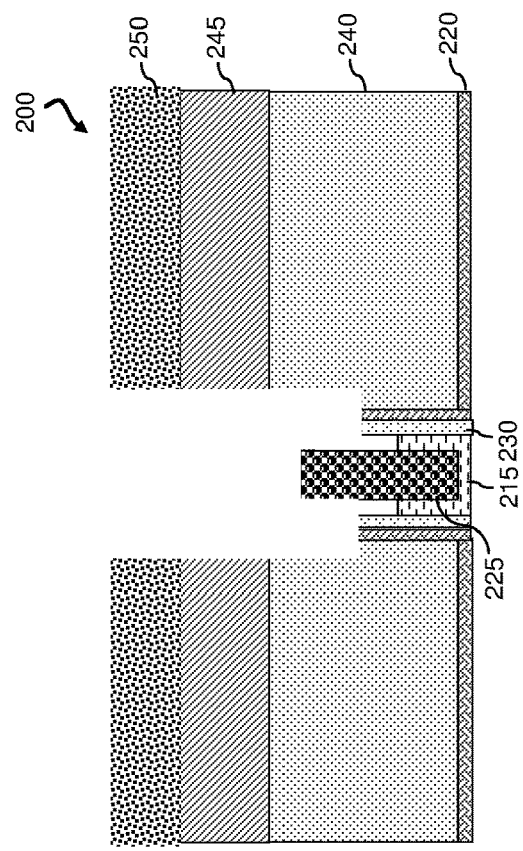
FIG. 4B is a cross-sectional view of the structure along a section line BB transversely through the gate contact after removal of portions of the high-k and WFM.
Figure 4A:
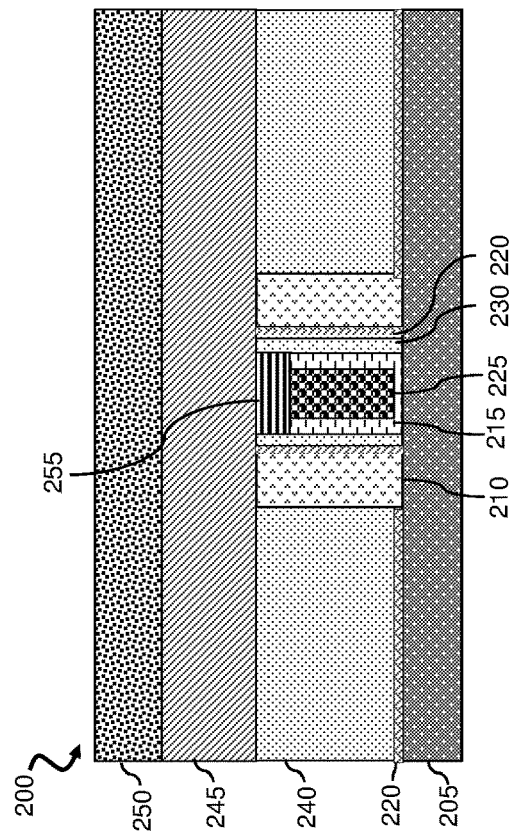
FIG. 4A is a cross-sectional view of the structure along a section line AA transversely through fins after removal of portions of the high-k and work function metal (WFM) according to embodiments of the present invention.

FIG. 4A is a cross-sectional view of the structure 200 along a section line AA transversely through fins 205 according to embodiments of the present invention. Structure 200 is unchanged from the structure 200 of FIG. 3A.

FIG. 4B is a cross-sectional view of the structure 200 along a section line BB transversely through CB 235 after removal of portions of the high-k and WFM 215 according to embodiments of the present invention. The high-k and WFM 215 can be selectively etched according to the material associated with the gate 225.

FIG. 5A is a cross-sectional view of the structure 200 along a section line AA transversely through fins 205 after removal of CB mask 250 according to embodiments of the present invention. CB mask 250 can be removed using any suitable etching process. FIG. 5B is a cross-sectional view of the semiconductor device along a section line BB transversely through CB 235 after removal of CB mask 250 according to embodiments of the present invention.

FIG. 6A is a cross-sectional view of the structure 200 along a section line AA transversely through fins 205 after deposition of barrier layer 260 according to embodiments of the present invention. The barrier layer 260 can be formed on the spacer layer 245. In one or more embodiments, the barrier layer 260 can have a thickness in the range of about 2 nm to about 15 nm and a height of 1 nm to 15 nm. The barrier layer 260 can be any suitable dielectric material, for example, carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof. In some embodiments of the invention, the barrier layer 260 can include silicon nitride. The barrier layer 260 can be formed utilizing a deposition process such as, for example, CVD, plasma enhanced chemical vapor deposition (PECVD), or chemical solution deposition.

FIG. 6B is a cross-sectional view of the structure 200 along a section line BB transversely through CB 235 after deposition of barrier layer 260 according to embodiments of the present invention. The barrier layer 260 can be formed on the spacer layer 245, the spacer layer 230, the liner 220 and WFM layer 215. The barrier layer 260 can also be formed on and along portions of the gate 225. The barrier layer 260 formed on the WFM 215 can fill a recess formed after the removal of portions of the WFM 215.

Figure 7B:
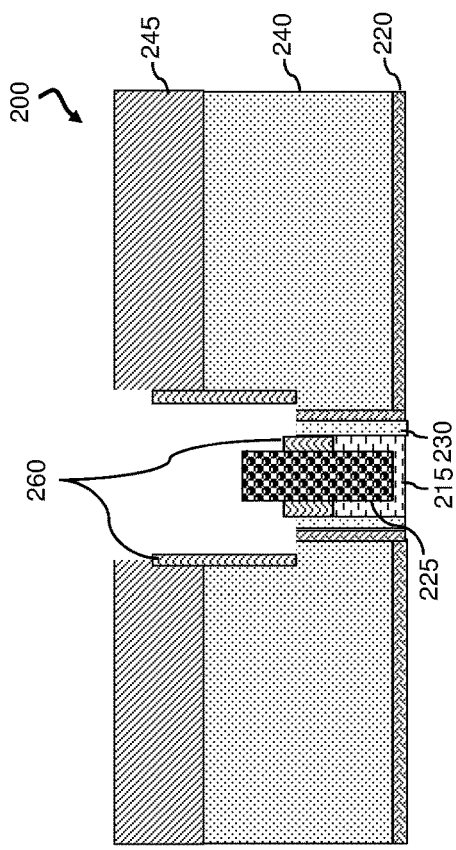
FIG. 7B is a cross-sectional view of the structure along a section line BB transversely through the gate contact after removal of portions of the barrier layer according to embodiments of the present invention.
Figure 7A:
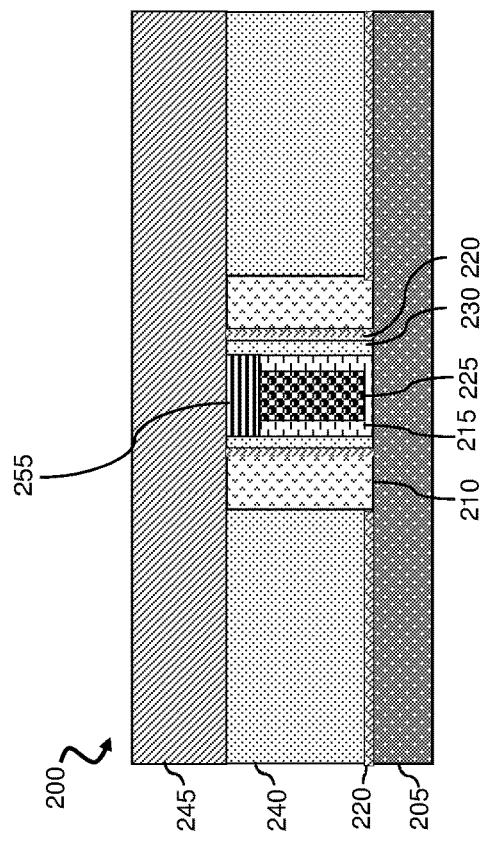
FIG. 7A is a cross-sectional view of the structure along a section line AA transversely through fins after removal of the barrier layer according to embodiments of the present invention.

FIG. 7A is a cross-sectional view of the structure 200 along a section line AA transversely through fins 205 after removal of the barrier layer 260 according to embodiments of the present invention. The barrier layer 260 can be removed using any suitable etching process.

FIG. 7B is a cross-sectional view of the structure 200 along a section line BB transversely through CB 235 after removal of portions of the barrier layer 260 according to embodiments of the present invention. The barrier layer 260 can be etched to expose portions of the spacer layer 245, the filling material 240, the spacer layer 230, and the liner 220.

Figure 8B:
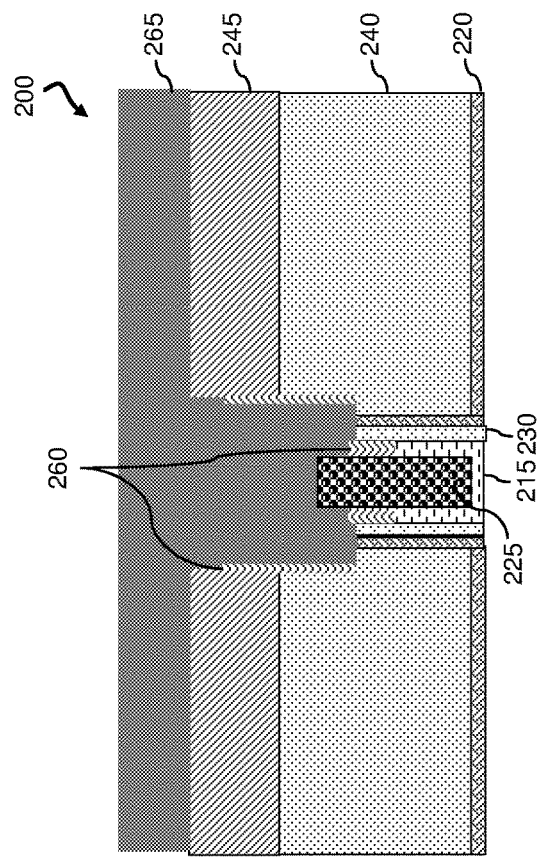
FIG. 8B is a cross-sectional view of the structure along a section line BB transversely through the gate contact after deposition of the CA mask according to embodiments of the present invention.
Figure 8A:
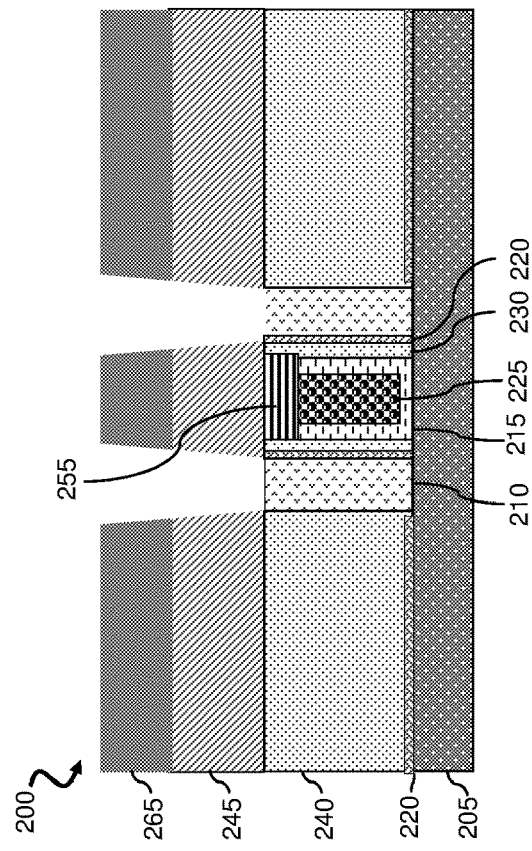
FIG. 8A is a cross-sectional view of the structure along a section line AA transversely through fins after deposition of a contact to substrate (CA) mask and removal of portions of the CA mask and portions of the spacer layer according to embodiments of the present invention.

FIG. 8A is a cross-sectional view of the structure 200 along a section line AA transversely through fins 205 after deposition of a contact to substrate (CA) mask 265 and removal of portions of the CA mask 265 and portions of the spacer layer 245 according to embodiments of the present invention. The CA mask 265 can be formed on the spacer layer 245. The CA mask 265 can include, for example, a silicon nitride (SiN) hardmask. The CA mask 265 can be deposited using a deposition process, including, but not limited to, PVD, CVD, PECVD, or any combination thereof. Other mask compositions can include silicon oxides, silicon oxynitrides, silicon carbides, silicon carbonitrides, etc. Spin-on dielectrics can also be utilized as a hard mask material including, but not limited to, silsequioxanes, siloxanes, and boron phosphate silicate glass (BPSG) or the like. The CA mask 265 can have a single material or multiple materials.

Portions of the CA mask 265 and portions of the spacer layer 245 can be removed using any suitable etching process. The removal of portions of the CA mask 265 and the spacer layer 245 can expose portions of TS 210.

FIG. 8B is a cross-sectional view of the structure 200 along a section line BB transversely through CB 235 after deposition of CA mask 265 according to embodiments of the present invention. The CA mask 265 can be deposited on the spacer layer 245, the filling material 240, liner 220, the spacer layer 230, the gate 225 and the barrier layer 260.

Figure 9B:
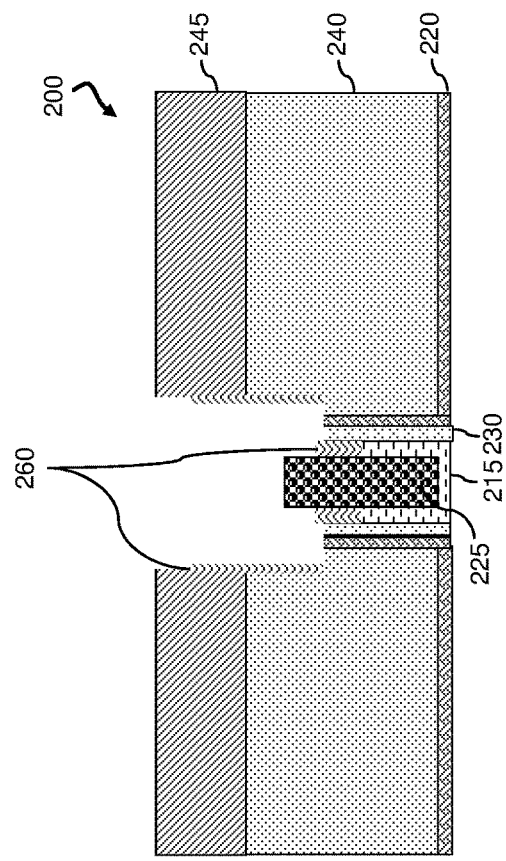
FIG. 9B is a cross-sectional view of the semiconductor device along a section line BB transversely through the gate contact after removal of the CA mask according to embodiments of the present invention.
Figure 9A:
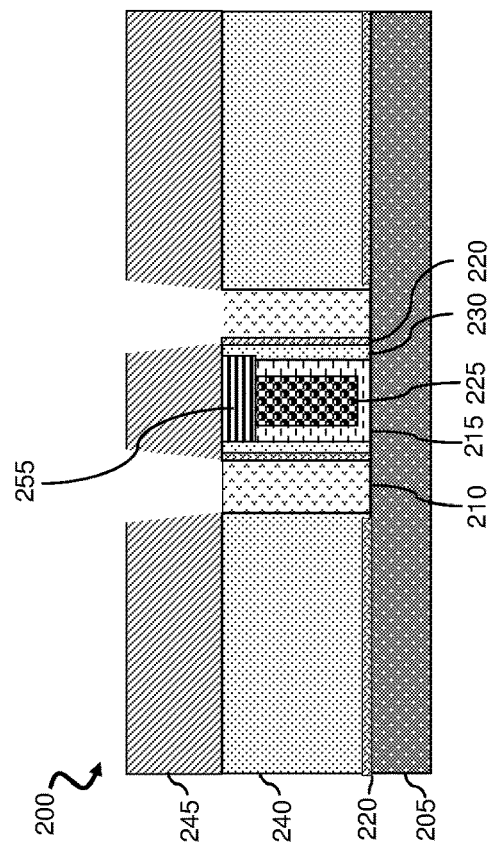
FIG. 9A is a cross-sectional view of the structure along a section line AA transversely through fins after removal of the CA mask according to embodiments of the present invention.

FIG. 9A is a cross-sectional view of the structure 200 along a section line AA transversely through fins 205 after removal of CA mask 265 according to embodiments of the present invention. CA mask 265 can be removed using any suitable etching process. FIG. 9B is a cross-sectional view of the semiconductor device along a section line BB transversely through CB 235 after removal of CA mask 265 according to embodiments of the present invention.

FIG. 10A is a cross-sectional view of the structure 200 along a section line AA transversely through fins 205 after formation of contacts CA 275 according to one or more embodiments. Contacts CA 275 can be formed atop TS 210 and along portions of the spacer layer 245. The formation of contacts CA 275 can occur during a middle of the line process to provide electrical connections to a S/D.

Contacts CA 275 can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, carbon nanotube, conductive carbon, graphene, or any suitable combination of these materials. Contact CA 275 as illustrated can be, for example, copper (Cu), ruthenium (Ru) or any other low resistance metal. The conductive material can further include dopants that are incorporated during or after deposition. Contacts CA 275 can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

FIG. 10B is a cross-sectional view of the semiconductor device along a section line BB transversely through CB 235 after formation of the contact CB 235 according to embodiments of the present invention. The contact CB 235 can be formed on the spacer layer 245, the filling material 240, liner 220, the spacer layer 230, the gate 225 and the barrier layer 260.

Contacts CB 235 can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. Contact CB 235 as illustrated can be, for example, copper (Cu), ruthenium (Ru) or any other low resistance metal. The conductive material can further include dopants that are incorporated during or after deposition. Contact CB 235 can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Accordingly, embodiments described herein provide methods and structures for forming a FinFET having a low resistance gate contact. The low resistance gate contact is formed on a silicon nitride barrier deposited between the low resistance copper gate contact and work function metal thereby avoiding reliability issues associated with using a high resistance material for the gate contact. Moreover, the described low resistance gate contact reduces a gate contact resistance due to the use of copper as the gate contact material instead of using tungsten or cobalt.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The invention claimed is:

1. A semiconductor device comprising:
   a fin coupled to a source or a drain (S/D);
   a work function metal coupled to the fin and a gate;
   a liner coupled to the work function metal;
   a first contact coupled to the gate, wherein the liner provides a barrier between the first contact and the work function metal;
   a trench silicide region coupled to the fin; and
   a second contact coupled to the trench silicide region, wherein the liner is comprised of silicon nitride.

2. The semiconductor device of claim 1, wherein the first contact and the second contact are comprised as a low-resistance metal.

3. The semiconductor device of claim 2, wherein the low-resistance metal is copper.

4. The semiconductor device of claim 1, wherein the liner width is 2-15 nanometers.

5. The semiconductor device of claim 1, wherein the liner is 1-15 nanometers in height.

6. The semiconductor device of claim 1, wherein portions of the work function metal are etched to form a recess, wherein the liner resides in the recess.

7. The semiconductor device of claim 1 further comprising a dielectric, wherein the dielectric is associated with the work function metal.

8. The semiconductor device of claim 7, wherein portions of the dielectric are etched to a height of the etched work function metal.

9. The semiconductor device of claim 8, wherein the recess is formed using the etched dielectric.

\* \* \* \* \*